(12) United States Patent
Shi et al.

(10) Patent No.: US 7,307,560 B2
(45) Date of Patent: Dec. 11, 2007

(54) PHASE LINEARITY TEST CIRCUIT

(75) Inventors: Xudong Shi, Sunnyvale, CA (US); Fariborz Assaderaghi, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/414,751

(22) Filed: Apr. 28, 2006

(65) Prior Publication Data

US 2007/0252735 A1    Nov. 1, 2007

(51) Int. Cl.
*H03M 1/06* (2006.01)
(52) U.S. Cl. ...................... 341/118; 341/120
(58) Field of Classification Search ......... 341/115–155
See application file for complete search history.

(56) References Cited

U.S. PATENT DOCUMENTS

| | | | |
|---|---|---|---|
| 6,366,225 B1 * | 4/2002 | Ozdemir .................. | 341/111 |
| 6,438,721 B1 * | 8/2002 | Wente ..................... | 341/120 |
| 6,512,473 B2 * | 1/2003 | Sasaki ..................... | 341/155 |
| 6,816,987 B1 | 11/2004 | Olson et al. .............. | 714/704 |
| 6,850,051 B2 | 2/2005 | Roberts et al. ........... | 324/76.54 |
| 6,873,939 B1 | 3/2005 | Zerbe et al. .............. | 702/189 |
| 6,889,350 B2 | 5/2005 | Fought et al. ............. | 714/745 |
| 6,912,665 B2 | 6/2005 | Ellis et al. ................ | 713/401 |
| 6,944,692 B2 | 9/2005 | Smith et al. .............. | 710/106 |

OTHER PUBLICATIONS

Chang, K., et al., "Clocking and Circuit Design for a Parallel I/O on a First-Generation CELL Processor," 2005 IEEE Int'l Solid-State Circuits Conf., Feb. 6-10, 2005, pp. 526-615.
Chang, K., et al., "A 0.4-4 Gb/s CMOS Quad Transceiver Cell Using On-Chip Regulated Dual-Loop PLLs," IEEE Journal of Solid-State Circuits, vol. 38, No. 5, May 2003, pp. 747-754.
Chang, K., et al., "A 0.4-4 Gb/s CMOS Quad Transceiver Cell Using On-Chip Regulated Dual Loop PLLs," Symposium on VLSI Circuit Digest of Technical Papers, Jun. 13-15, 2002, pp. 88-91.

* cited by examiner

*Primary Examiner*—Rexford Barnie
*Assistant Examiner*—Lam T. Mai
(74) *Attorney, Agent, or Firm*—Morgan, Lewis & Bockius LLP

(57) ABSTRACT

A circuit includes a phase interpolator and a self test circuit. The phase interpolator is to provide a interpolator output having a phase corresponding to a respective phase step in a plurality of phase steps. The interpolator output is a weighted combination of one or more of a plurality of phasor signals. The self test circuit includes a phase detector coupled to a reference signal and the interpolator output, a phase-difference-to-voltage converter coupled to the phase detector, an analog-to-digital converter (ADC) coupled to the phase-difference-to-voltage converter, and control logic. The phase detector is to generate an output that is proportional to a phase difference between the reference signal and the interpolator output. The phase-difference-to-voltage converter is to convert the output from the phase detector into a corresponding voltage. The ADC is to convert an output from the phase-difference-to-voltage converter into a corresponding digital value. The control logic is to test the phase interpolator using the self-test circuit.

30 Claims, 11 Drawing Sheets

PHASE LINEARITY TEST CIRCUIT

FIELD

The subject matter disclosed herein relates generally to self-test circuits for use in integrated circuits, and in particular, to self-test circuits for determining timing interpolator and/or phase interpolator linearity.

BACKGROUND

Low bit-error-rate (BER) communication of data over a communications channel is often considered an important requirement in many systems. The BER is a function of many parameters, including a phase of a clock signal or phases of clock signals. An incorrect phase or timing of a respective clock signal may reduce a timing margin and/or increase the BER. As a consequence, communications devices and systems often include components, such as phase locked loops, delay locked loops and phase interpolators, that allow the phase of the respective clock signal to be adjusted. For example, a phase interpolator may generate the respective clock signal having the phase that corresponds to a control signal applied to the phase interpolator. The control signal may specify a phase step or setting.

Unfortunately, there may be nonlinearities or errors in a mapping from the phase code or step to the phase of the respective clock signal. Resulting phase errors may adversely impact the device and/or system performance, as discussed above. As a consequence, testing of such nonlinearities (or the converse, timing linearity) is often included in the characterization and acceptance of devices, such as integrated circuits. This testing is often performed using dedicated, external test equipment. Such test equipment, however, is often expensive. The accuracy and/or repeatability of the test equipment may be insufficient. And testing for nonlinearities over a wide range of phase steps may be time consuming, thereby further increasing the expense.

There is a need, therefore, for improved testing equipment for characterizing phase linearity.

BRIEF DESCRIPTION OF THE DRAWINGS

For a better understanding, reference should be made to the following detailed description taken in conjunction with the accompanying drawings, in which.

Like reference numerals refer to corresponding parts throughout the drawings.

DETAILED DESCRIPTION OF EMBODIMENTS

Figure 1:
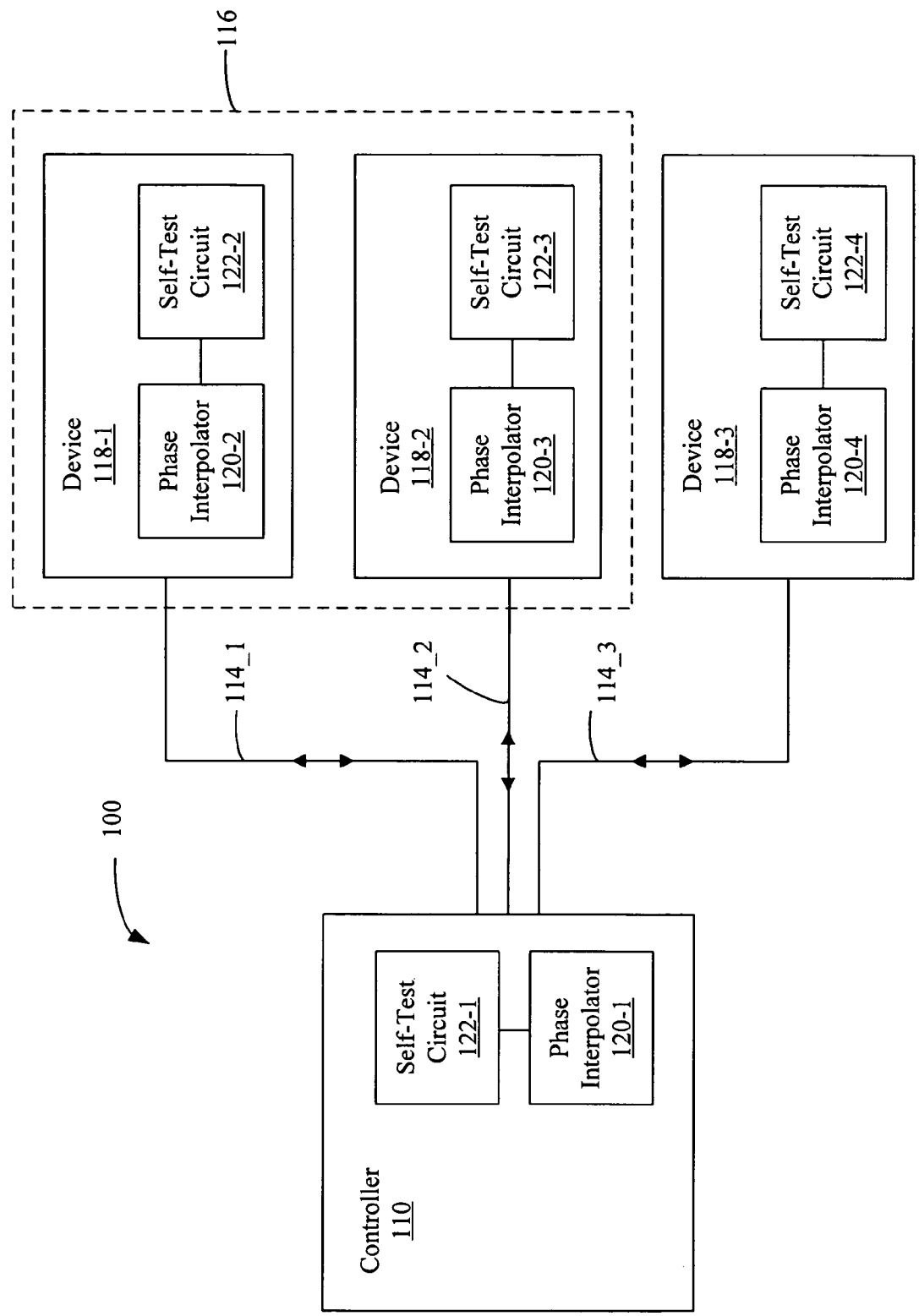
FIG. 1 is a block diagram illustrating an embodiment of a system.

A circuit is described. The circuit includes a phase interpolator and a self test circuit. The phase interpolator is to provide an interpolator output having a phase corresponding to a respective phase step in a plurality of phase steps. The interpolator output is a weighted combination of one or more phasor signals. The self test circuit includes a phase detector coupled to a reference signal and the interpolator output, a phase-difference-to-voltage converter coupled to the phase detector, an analog-to-digital converter (ADC) coupled to the charge pump, and control logic. The phase detector is to generate an output that is proportional to a phase difference between the reference signal and the interpolator output. The phase-difference-to-voltage converter is to convert the output from the phase detector into a corresponding voltage. The ADC is to convert an output from the phase-difference-to-voltage converter into a corresponding digital value. The control logic is to test the phase interpolator using the self-test circuit.

In some embodiments, the output from the phase detector may include one or more pulses. The interpolator output and the reference signal may each be periodic signals having a same fundamental frequency. The reference signal may be provided by a voltage controlled oscillator.

In some embodiments, the phase-difference-to-voltage converter includes an integrator coupled to a charge pump. The integrator is to integrate the output of the charge pump for a pre-determined number of clock cycles and to output a corresponding voltage. In some embodiments, the integrator includes a reset. The reset is to set an output of the integrator to approximately zero after the pre-determined number of clock cycles.

In some embodiments, the circuit further includes a multiplexer coupled to the phase detector and the self-test circuit. The multiplexer is to couple the reference signal to the phase detector. The reference signal may correspond to a respective phasor in the plurality of phasor signals (such as those provided by a voltage controlled oscillator) for a corresponding subset of the plurality of phase steps. The subset of phase steps may correspond to a respective subset of a predefined range of phases.

In some embodiments, the circuit further includes an offset cancellation circuit. The offset cancellation circuit may adjust the phase-difference-to-voltage converter such that the digital value corresponds to approximately zero phase difference when the reference signal and the interpolator output each correspond to the respective phasor signal.

In another embodiment, a method of determining linearity of the phase interpolator is described. In the method, a calibration scale for a circuit is determined. The circuit generates an output corresponding to the phase difference between the interpolator output provided by the phase interpolator and the reference signal. The calibration scale is a ratio of an output from the circuit corresponding to the predefined range of phases divided by a number of phase steps. An expected output from the circuit for the respective phase of the interpolator output is calculated. The respective phase corresponds to the respective phase code or step in the plurality of phase codes or steps. A respective output from the circuit for the respective phase of the interpolator output is measured. The expected output and the measured output are compared. The comparing produces a metric of the linearity of the phase interpolator for the respective phase of the interpolator output.

In some embodiments, the method is performed as part of self-test in an integrated circuit. The output from the circuit may correspond to a summation of a plurality of outputs. A respective output in the plurality of outputs may correspond to the respective subset of the predefined range of phases. The summation may occur for outputs corresponding to boundaries between the plurality of outputs, i.e., at the boundary between predefined ranges of phases.

In some embodiments, the measuring is performed while determining the calibration scale. The reference signal may correspond to the respective phasor in the plurality of phasor signals for the subset of the plurality of phase steps corresponding to the respective subset of the predefined range of phases. The reference signal may be provided by the voltage controlled oscillator.

In some embodiments, the interpolator output is a weighted combination of one or more phasor signals. The comparing includes generating an output that is proportional to the phase difference between the reference signal and the interpolator output, converting the output from the phase detector into the corresponding charge, and converting the charge into the corresponding digital value.

In some embodiments, the method further includes scaling the metric by a time interval corresponding to the respective phase step. In some embodiments, the method further includes repeating the calculating, measuring and comparing operations for the plurality of phases of the interpolator output corresponding to the plurality of phase steps. In some embodiments, the method further includes determining if the metric corresponding to at least one of the plurality of phases of the interpolator output exceeds a pre-determined threshold.

By incorporating a self-test circuit, the linearity of one or more phase interpolators in one or more integrated circuits can be determined. The self-test circuit may allow faster, lower cost and more accurate characterization of such self-test circuits that existing test equipment.

Reference will now be made in detail to embodiments, examples of which are illustrated in the accompanying drawings. In the following detailed description, numerous specific details are set forth in order to provide a thorough understanding of the subject matter presented herein. However, it will be apparent to one of ordinary skill in the art that the subject matter may be practiced without these specific details. In other instances, well-known methods, procedures, components, and circuits have not been described in detail so as not to unnecessarily obscure aspects of the embodiments.

A self-test circuit and related methods are described. The self-test circuit and methods may be used to determine the linearity, or conversely the nonlinearity or errors, in a mapping from a control signal to a phase of a interpolator output or phases of interpolator outputs that are generated by one or more phase interpolators. In some embodiments, the self-test circuit may be used to determine the linearity of one or more phase locked loops and/or delay locked loops. The control signal may correspond to one or more phase codes or steps in a plurality of phase codes or steps in the one or more phase interpolators. The self-test circuit may be included in an integrated circuit. For instance, the integrated circuit may be a memory controller and/or a memory device. The memory device may include a memory core that utilizes solid-state memory, semiconductor memory, organic memory and/or another memory material, including volatile and/or non-volatile memory. The memory device may include dynamic random access memory (DRAM), static random access memory (SRAM) and/or electrically erasable programmable read-only memory (EEPROM). The self-test circuit may be included in one or more components in a memory system, such as a memory controller and/or one or more memory devices. The one or more memory devices may be embedded in one or more memory modules. The memory controller and the one or more memory devices may be on a common or same circuit board. The self-test circuit may be included in one or more components in other systems, such as those that include logic chips, including a serializer/deserializer, PCI Express and/or other high-speed input/output links.

In some embodiments, the self-test circuit is coupled (e.g., by a multiplexer) to the interpolator output provided by the phase interpolator and a reference signal. The interpolator output may be a weighted combination of one or more phasor signals. The phase of the interpolator output may correspond to a respective phase step in the plurality of phase steps. The reference signal may correspond to a respective phasor in a plurality of phasor signals for a corresponding subset of the plurality of phase steps. The subset of phase steps may correspond to a respective subset of a predefined range of phases. In an exemplary embodiment, the predefined range of phases may include 0 to 360°. The reference signal may be provided by a voltage controlled oscillator. The interpolator output and the reference signal may each be periodic signals having the same fundamental frequency.

In some embodiments, the self-test circuit includes a phase detector coupled to the reference signal and the interpolator output, a phase-difference-to-voltage converter coupled to the phase detector, an analog-to-digital converter (ADC) coupled to the charge pump, and control logic. The phase detector may generate an output that is proportional to a phase difference between the reference signal and the interpolator output. The phase-difference-to-voltage converter may convert the output from the phase detector into a corresponding voltage. The ADC may convert the voltage output from the phase-difference-to-voltage converter into a corresponding digital value. The control logic may test the phase interpolator using the self-test circuit.

In some embodiments, the phase-difference-to-voltage converter includes a charge pump coupled to the phase detector and an integrator to integrate the output of the charge pump for a number of clock periods or cycles, such as 100 clock cycles, and to output a corresponding voltage. An inverse of the clock period may correspond to the fundamental frequency. The integrator may include a reset. The reset is to set an output of the integrator to approximately zero after the pre-determined number of clock cycles.

In some embodiments, the self-test circuit further includes an offset cancellation circuit. The offset cancellation circuit may adjust the phase-difference-to-voltage converter such that the digital value corresponds to approximately zero phase difference when the reference signal and the interpolator output each correspond to the respective phasor signal.

In a method of using a self-test circuit, a calibration scale for the self-test circuit is determined. The self-test circuit generates an output corresponding to the phase difference. The calibration scale is a ratio of an output from the self-test circuit corresponding to the predefined range of phases divided by a number of phase steps. In some embodiments, the output from the circuit corresponds to a summation of a plurality of outputs. A respective output in the plurality of outputs corresponds to the respective subset of the predefined range of phases. The summation may occur for outputs at boundaries between the plurality of outputs, i.e., at the boundary between predefined ranges of phases. An expected output from the self-test circuit for a respective phase of the interpolator output is calculated. The respective phase corresponds to the respective phase step in the plurality of phase steps. A respective output from the circuit for the respective phase of the interpolator output is measured. In some embodiments, the measuring may be performed while determining the calibration scale. The expected output and the measured output are compared. The comparing produces a metric of the linearity of the phase interpolator for the respective phase of the interpolator output.

The method may further include scaling the metric by a time interval corresponding to the respective phase step. The operations of calculating, measuring and comparing may be repeated for the plurality of phases of the interpolator output corresponding to the plurality of phase steps. In some embodiments, the method further includes determining if the metric corresponding to at least one of the plurality of phases of the interpolator output exceeds a pre-determined threshold corresponding to a pass or fail criterion.

Attention is now directed towards embodiments that address the difficulties associated with the existing test equipment described above. FIG. 1 is a block diagram illustrating an embodiment of a system 100. The system 100 includes at least one controller 110 and one or more devices 118, such as one or more memory devices. While FIG. 1 illustrates the system 100 having one controller 110 and three devices 118, other embodiments may have additional controllers and fewer or more devices 118. Also, while the system 100 illustrates the controller 110 coupled to multiple devices 118, in other embodiments two or more controllers may be coupled to one another. The controller 110 may include a phase interpolator 120-1 and a self-test circuit 122-1. Optionally, one or more of the devices 118 may include at least one of the phase interpolators 120 and a self-test circuit 122. In some embodiments, some of the devices 118 may not have the phase interpolator 120 and/or the self-test circuit 122. In some embodiments, the controller 110 and/or one or more of the devices 118 may include more than one phase interpolator 120 that may share one or more self-test circuits 122. In embodiments where the devices 118 are memory devices, two or more of the devices, such as devices 118-1 and 118-2, may be configured as a memory bank 116.

The controller 110 and the devices 118 are connected by one or more links 114. While the system 100 illustrates three links 114, other embodiments may have fewer or more links 114. The links 114 may be used for bi-directional and/or uni-directional communications between the controller 110 and one or more of the devices 118.

Bi-directional communication may be simultaneous. In some embodiments, one or more of the links 114 and corresponding transmitters (not shown) and/or receivers (not shown) may be dynamically configured, for example, by control logic (not shown), for bi-directional and/or unidirectional communication.

Data may be communicated on one or more of the links 114 using one or more sub-channels, such as a baseband sub-channel corresponding to a first frequency band and/or a passband sub-channel corresponding to a second frequency band. In some embodiments, such as those where at least one of the links 114 is ac-coupled, the baseband sub-channel may not contain DC (i.e., does not include 0 Hz). In some embodiments, the first frequency band and the second frequency band may be orthogonal. In other embodiments there may be substantial overlap of one or more neighboring pairs of frequency bands. A respective sub-channel may also correspond to a group of frequency bands.

One or more of the self-test circuits 122 may be used to determine the linearity, or conversely the nonlinearity or errors, in the mapping from a control signal to a phase of one or more interpolator outputs that are generated by one or more of the phase interpolators 120. Henceforth, this is referred to as determining the linearity of one or more of the phase interpolators 120. The self-test circuits 122 may allow faster, cheaper and/or more accurate characterization of the linearity than existing test equipment.

Figure 2:
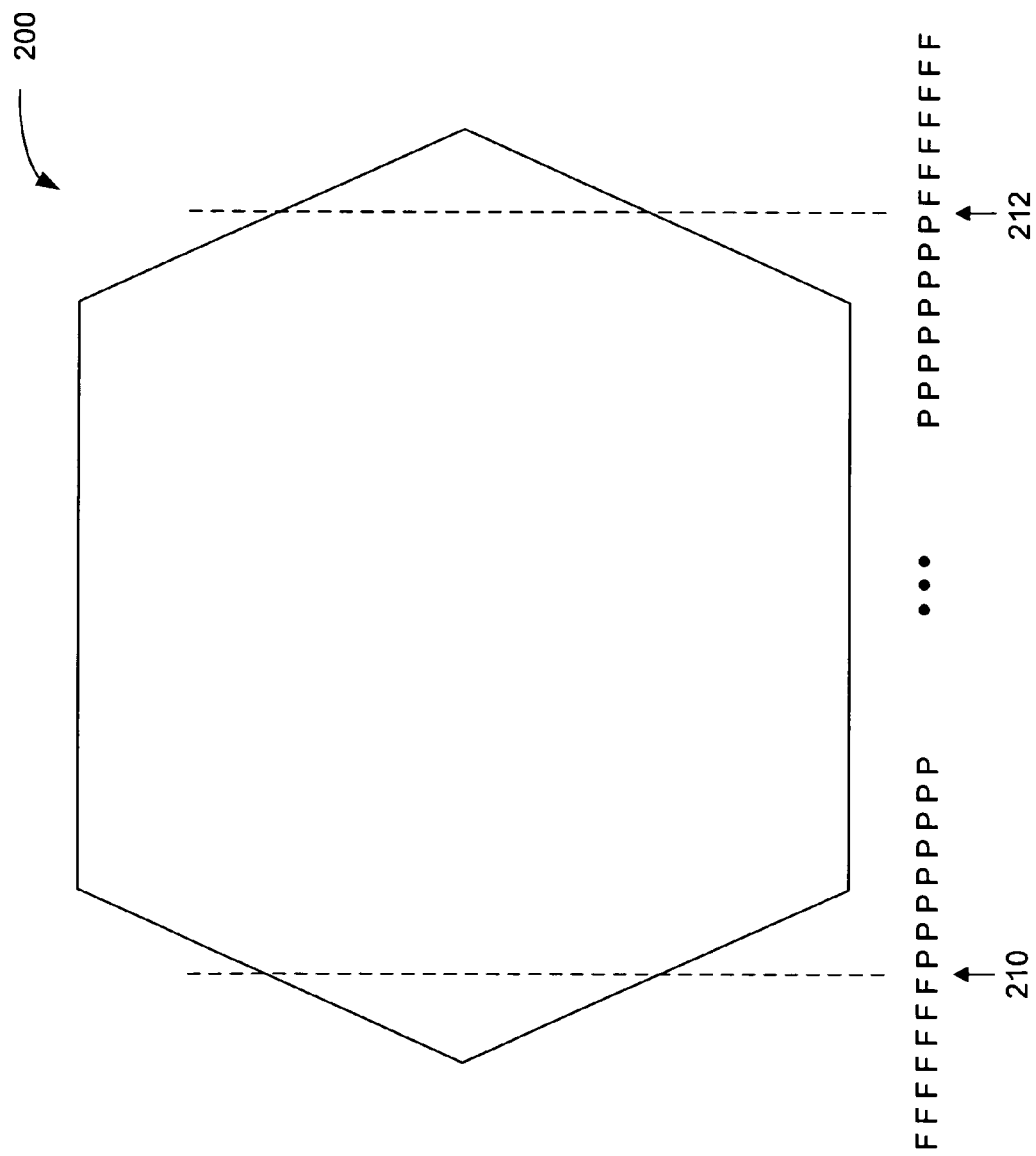
FIG. 2 illustrates an embodiment of an eye pattern.

When characterizing the phase interpolators 120, a timing margin associated with a portion of one or more links 114 that include the phase interpolators 120 may be determined. This is shown in FIG. 2, which illustrates an example of an eye pattern 200. The eye pattern 200 corresponds to a pattern of signals received by a receiver using one of the links 114 (FIG. 1). By adjusting the phase of one or more clock signals that are generated by one or more of the phase interpolators 120 in FIG. 1 (such as the clock signal used to determine transmit time for a transmitter coupled to one of the links 114 in FIG. 1 and/or the clock signal that determines a sampling time of a receiver that is coupled to one of the links 114), the phase may be swept across the eye pattern 200. Typically, only a subset of the phases will result in an acceptable BER. Phases that yield an acceptable BER may be labeled as passing (P) and phases that yield an unacceptable BER may be labeled as failing (F). The range of allowed phases (i.e., phases with acceptable BER) typically includes a central portion of the eye pattern 200. The range of allowed phases has a left-hand or fail-pass (FP) boundary 210 and a right-hand or pass-fail (PF) boundary 212.

Figure 3:
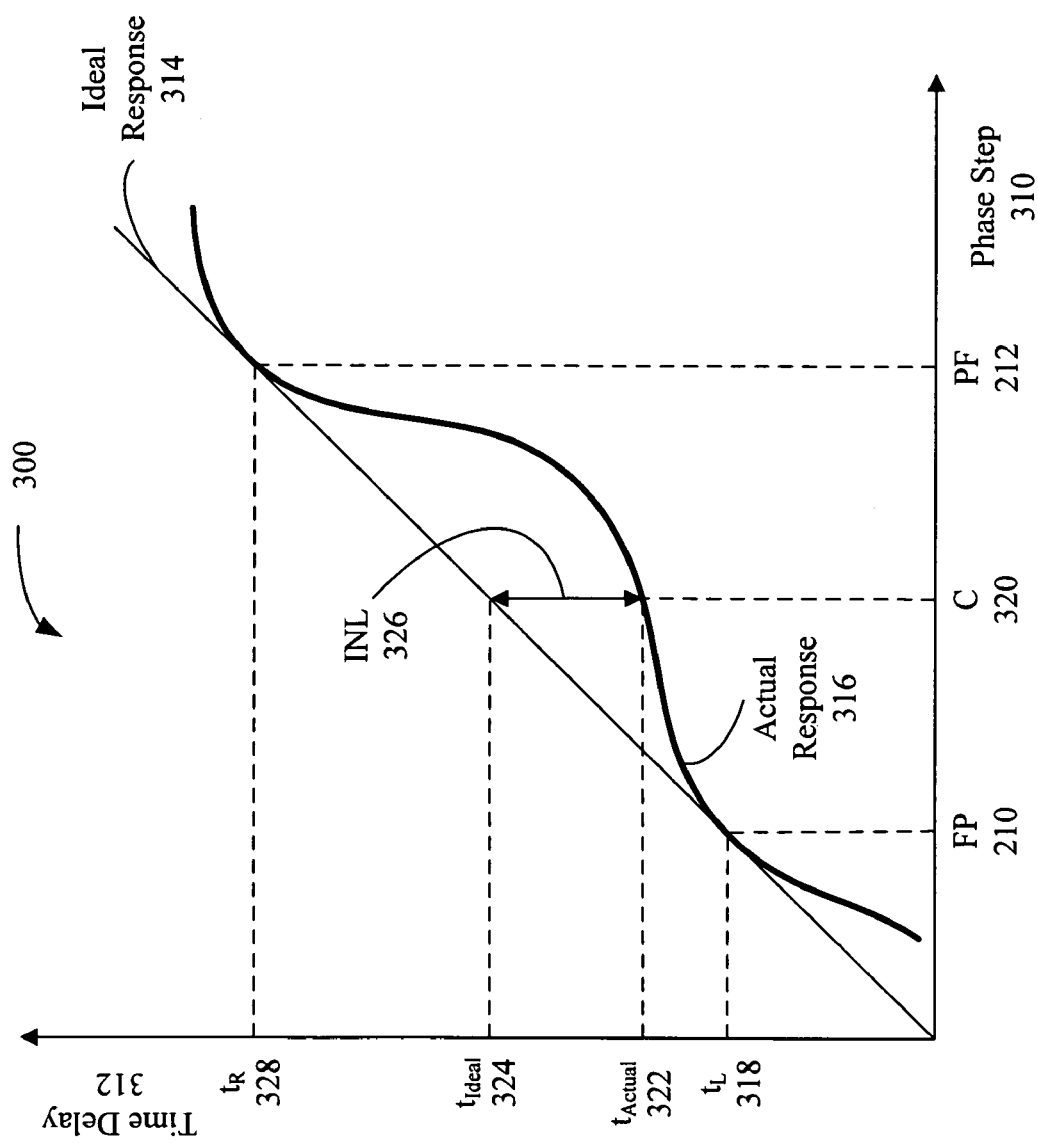
FIG. 3 illustrates an embodiment of ideal phase response and an actual phase response.

Errors in mapping from the control signal to one or more phases of one or more signals, such as the one or more clock signals generated by one or more of the phase interpolators 120 (FIG. 1) may reduce the timing margin, and thus, increase the BER on one or more of the links 114 (FIG. 1). Such errors, therefore, may reduce the performance of the system 100 (FIG. 1). A schematic example of errors in mapping are shown in FIG. 3, which illustrates a prophetic example 300 of an ideal phase response 314 and an actual phase response 316.

The mapping example 300 is a plot of time delay 312 of signals generated by one or more phase interpolators 120 (FIG. 1) as a function of a phase step 310. The time delay 312 divided by the clock period is proportional to the phase delay. The mapping example 300 shows an exemplary FP boundary 210 and PF boundary 212. These correspond, respectively, to time delays $t_L$ 318 and $t_R$ 328. A mean of the FP boundary 210 and the PF boundary 212 is a central phase step (C) 320. Based on the ideal response 314, the central phase step (C) 320 corresponds to an ideal time delay $t_{Ideal}$ 324. Based on the actual response 316, however, the central phase step (C) 320 corresponds to an actual time delay $t_{Actual}$ 322. A difference between the ideal time delay $t_{Ideal}$ 324 and the actual time delay $t_{Actual}$ 322 is an integral nonlinearity (INL) 326 at the central phase step (C) 320. Similar integral nonlinearity values may be determined at other phase steps 310. Note that a difference in the integral nonlinearity for two adjacent or neighboring phase steps 310 is referred to as a differential nonlinearity. A respective integral nonlinearity includes the cumulative nonlinearity associated with a respective phase step, such as the central phase step (C) 320.

Figure 4:
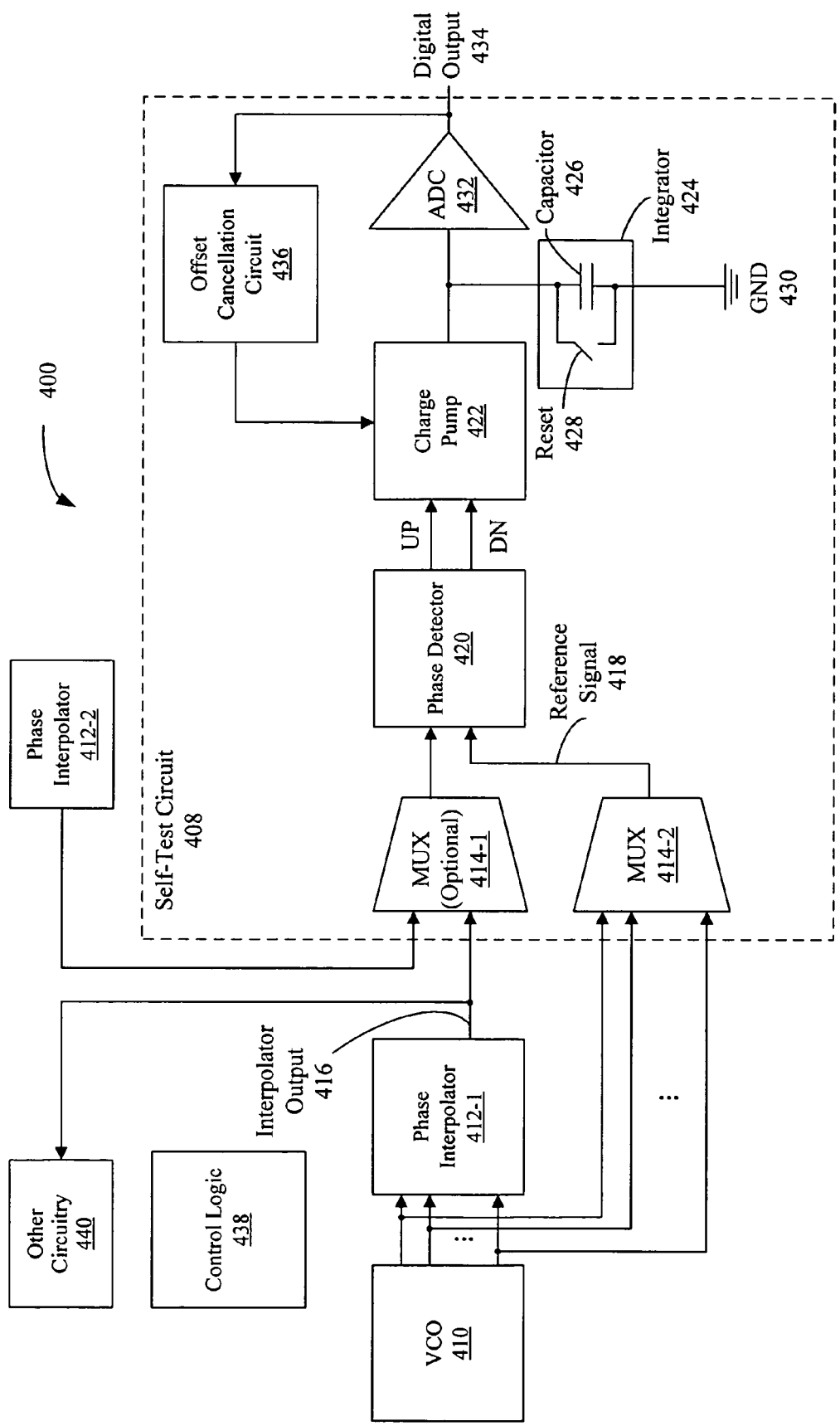
FIG. 4 is a block diagram illustrating an embodiment of a self-test circuit.

As discussed previously, determining the linearity of one or more phase interpolators 120 (FIG. 1) using existing test equipment may be time consuming and expensive. In addition, the existing test equipment may not have sufficient accuracy. These challenges may be reduced and/or eliminated using a self-test circuit. FIG. 4 is a block diagram illustrating an embodiment of a system 400 (e.g., an integrated circuit) that includes a self-test circuit 408, which may be used to determine the linearity of one or more phase interpolators. A voltage controlled oscillator (VCO) 410 generates a plurality of phasors. In some embodiments, the VCO 410 includes multiple stages and may generate multiple phase outputs or phasors. In an exemplary embodiment, there are eight phasors, corresponding to 0°, 45°, 90° and so on through 315°. The plurality of phasors are coupled to a phase interpolator 412-1. The phase interpolator 412-1 generates at least one output, a interpolator output 416, that is coupled to a phase detector 420 in the self-test circuit 408.

The output of the phase interpolator 412-1 also goes to other circuitry 440, such one or more signal transmitters and/or one or more signal receivers. The signal transmitters and/or signal receivers may be coupled to connectors, which in turn are configured or configurable for connection to a communication link between the system 400 and one or more other systems or integrated circuits.

The interpolator output 416 is a weighted combination of one or more of the phasors. The combination of phasors may be selected using a control signal from control logic 438. For example, in one embodiment, the interpolator output 416 is a weighted combination of two adjacent phasors selected (by the control signal from control logic 438) from the eight phasors in accordance with a phase step. The interpolator output 416 has a phase corresponding to a respective phase step in a predefined set or range of phase steps. For example, the number of phase steps in the predefined set of phase steps may be equal to $2^N$, where N is a positive integer greater than 0. In one embodiment, N is equal to 6, while in other embodiments N is equal 7, 8, 9 and 10, respectively. The phase steps can be divided into ranges or subsets, each corresponding to a range of phases. Thus, the $2^N$ phase steps may be decomposed into $2^M$ ranges or subsets that each have $2^P$ phases. In one embodiment, each range or subset of phase steps corresponds to a 45° range of phases, e.g., M equals 3 and P equals 5. For example, a first subset of the phase steps may correspond to a range of 0° to 45° (or, more precisely, 0 to $$\frac{2\pi}{2^M}$$

radians, where $2^M$ is the total number of subsets and M equals 3), a second subset of the phase steps may correspond to a range of 45° to 90°, and so forth. This is discussed further below with reference to FIG. 7. In some embodiments, there may be coarse and fine phase steps in one or more of the ranges of phases.

The plurality of phasors are also coupled to a multiplexer (MUX) 414-2 in the self-test circuit 408. For a respective subset of the phase steps, a respective phasor is selected by the multiplexer 414-2 as a reference signal 418. The reference signal 418 is coupled to the phase detector 420. The respective phasor coupled to the phase detector 420 may be selected using a control signal from the control logic 438. The interpolator output 416 and the reference signal 418 may each be periodic signals, such as a square wave, having a same fundamental frequency.

Figure 6:
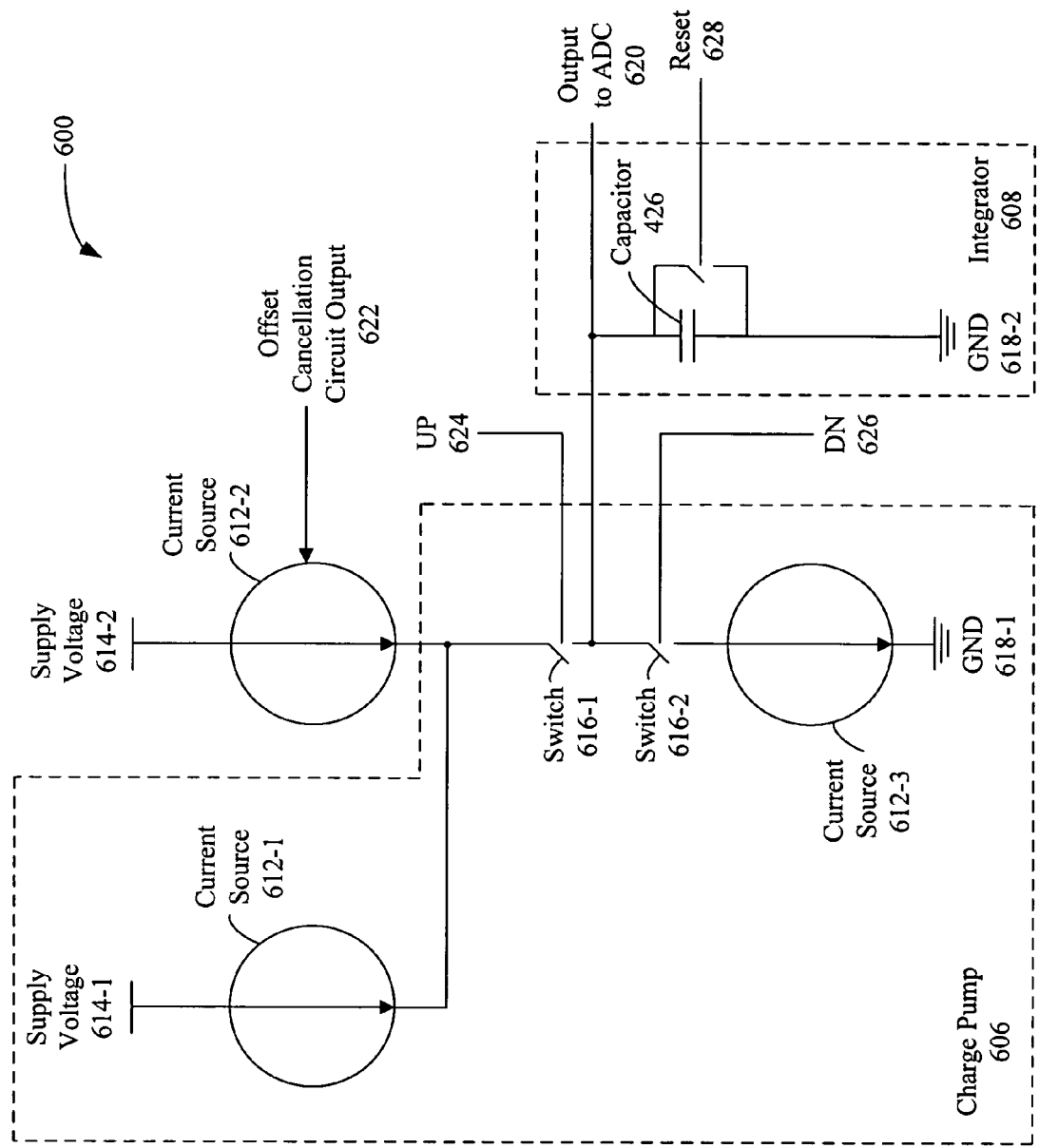
FIG. 6 is a diagram illustrating an embodiment of a phase-difference-to-voltage converter.

The phase detector 420 may generate an output that is proportional to a phase difference between the reference signal 418 and the interpolator output 416. In some embodiments, the output includes one or more pulses that have a width that is proportional to the phase difference. A charge pump 422 is coupled to the phase detector 420. The charge pump 422 may convert the output from the phase detector 420 into a corresponding charge. An analog-to-digital converter (ADC) 432 may be coupled to an output of the charge pump 422. As discussed below with reference to FIG. 6, the charge pump 420 and an integrator 424 coupled to an output of the charge pump together form a phase-difference-to-voltage converter 600 (FIG. 6). The ADC 432 may convert an output from the charge pump 422 (or equivalently, an output from the phase-difference-to-voltage converter) into a corresponding digital output 434. In an exemplary embodiment, the ADC 432 may have 8-bit resolution.

An integrator 424 may be coupled to the charge pump 422 and the ADC 432. The integrator 424 may integrate the charge output by the charge pump 422 for a pre-determined number of clock cycles. The integrator 424 may average out and/or reduce noise in the charge. The integrator 424 may output a corresponding voltage. In an exemplary embodiment, the predetermined number of clock cycles is 100 and the clock period corresponds to the fundamental frequency. The integrator 424 may include a capacitor 426 coupled to ground (GND) 430. The integrator 424 may include a reset 428. The reset 428 may set an output of the integrator 424 to approximately zero after the pre-determined number of clock cycles. The reset 428 may be controlled by a control signal provided by the control logic 438.

The self-test circuit 408 may include an offset cancellation circuit 436. The offset cancellation circuit 436 may adjust the charge pump 422 such that the digital output 434 corresponds to approximately zero phase difference when the reference signal 418 and the interpolator output 416 each correspond to the respective phasor signal. The offset cancellation circuit 436 may be controlled using a control signal from the control logic 438.

The offset cancellation circuit 436 may be useful when the one or more phasors in the phase interpolator 412-1 and/or the respective phasor (i.e., the reference signal 418) coupled to the phase detector 420 are changed, for example, when a different subset of the phase steps is tested. At a boundary of a respective subset of the phase steps, the interpolator output 416 and the respective signal 418 may each be substantially equal to the same respective phasor signal. Thus, in principle the phase difference between these signals should be zero. In practice, effects such as propagation delays due to different trace lengths may result in an inadvertent phase difference. The offset cancellation circuit 436 allows these inadvertent phase differences to be approximately set to zero at the output of the charge pump 422. This feature is discussed further below with reference to FIGS. 6 and 8.

In some embodiments, the system 400 may include fewer or additional components. The logical positions of one or more components may be changed. Two or more components may be combined into a single component. Some of the components may be shared by additional components. For example, the self-test circuit 408 may be shared with one or more additional phase interpolators, such as phase interpolator 412-2, that utilize the plurality of phasors provided by the VCO 410 or those provided by another VCO (not shown). In these embodiments, another optional multiplexer 414-1 may couple a respective interpolator output from one of the phase interpolators to the phase detector 420.

Figure 5:
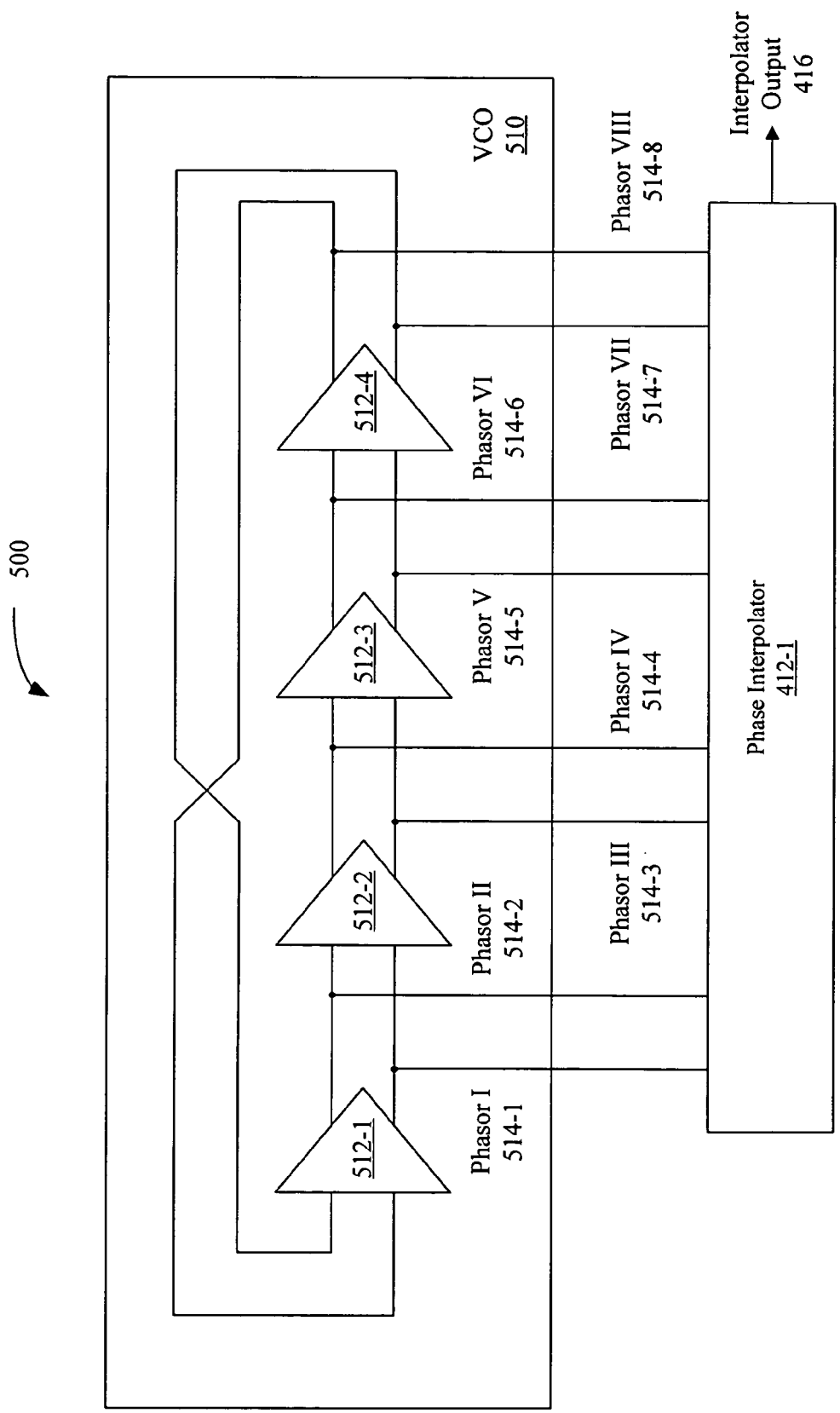
FIG. 5 is a block diagram illustrating an embodiment of a voltage controlled oscillator (VCO) and a phase interpolator.

FIG. 5 is a block diagram illustrating an embodiment 500 of a VCO 510 (such as the VCO 410) and the phase interpolator 412-1. The VCO 510 includes four inverter/ delay elements 512. Each inverter/delay element 512 is differential, generating an output and its complement. Outputs from inverter/delay element 512-4 are crossed before coupling to inputs of inverter/delay element 512-1. In this way, the VCO 510 is configured to oscillate even though it contains an even number of inverter/delay elements 512.

The outputs from the inverter/delay elements 512 are a plurality of phasors 514. These phasors 514 are coupled to the phase interpolator 412-1. The phase interpolator 412-1 uses one or more of these phasors 514 to generate the interpolator output 416.

In some embodiments, the VCO 510 and/or the phase interpolator 412-1 may include fewer or additional components. For example, there may be fewer or additional inverter/delay elements 512. Positions of one or more components may be changed. Two or more components may be combined into a single component.

FIG. 6 is a diagram illustrating an embodiment of a phase-difference-to-voltage converter 600. The phase-difference-to-voltage converter 600 may include a charge pump 606 (such as the charge pump 422 in FIG. 4) and an integrator 608 (such as the integrator 424 in FIG. 4). The charge pump 606 includes a first current source 612-1 that is coupled to supply voltage 614-1, switches 616 and a second current source 612-3 that is coupled to ground. The switches are coupled to up (UP) 624 and down (DN) 626 signals that are output by a phase detector, such as the phase detector 420 (FIG. 4). The integrator 608 includes the capacitor 426 coupled to circuit ground (GND) 618-2. Embodiment 600 also includes a voltage-controlled current source 612-2, which is coupled to supply voltage 614-2. The voltage-controlled current source 612-2 is adjusted by an output 622 from an offset cancellation circuit, such as the offset cancellation circuit 436 (FIG. 4).

During operation, the UP signal 624 and the DN signal 626 selectively couple either the first current source 612-1 to the integrator 608 or the second current source 612-3 to the integrator 608 using the switches 616. When the first current source 612-1 is selectively coupled to the integrator 608 (switch 616-1 is closed and switch 616-2 is open), the charge stored on the capacitor 426 is increased. When the second current source 612-3 is selectively coupled to the integrator 608 (switch 616-1 is open and switch 616-2 is closed), the charge stored on the capacitor 426 is decreased. The voltage-controlled current source 612-2 may be used to correct for a net offset or bias. The design is, therefore, symmetric. The difference between an output 620 from the integrator 608 to the ADC 432 (FIG. 4) with the switch 616-1 is closed and the output 620 when the switch 616-2 is closed is the net charge on the capacitor 426. A reset 628 may be used to set the charge on the capacitor 426 to zero.

In some embodiments, the charge pump 606 and/or the integrator 608 may include fewer or additional components. Positions of one or more components may be changed. Two or more components may be combined into a single component. In some embodiments the charge pump 606 and/or the integrator 608 can be implemented in a differential fashion, instead of the single-ended fashion shown here.

Figure 7:
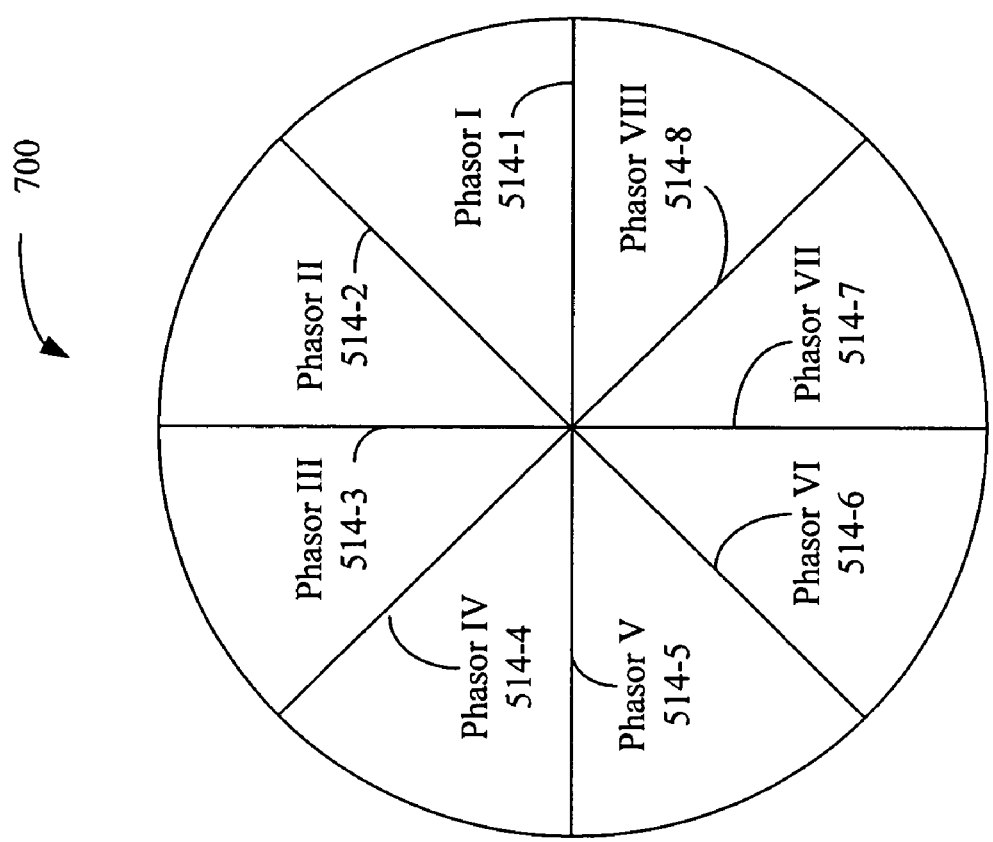
FIG. 7 illustrates an embodiment of phasor signals.

As discussed previously, in some embodiments the VCO 110 generates eight phasors, each offset from its neighbors by 45°. Furthermore, phase steps corresponding to a range of 45° are produced while each phasor is selected as the reference signal 418. This is illustrated in FIG. 7, which shows an embodiment 700 of the phasor signals 514. In other embodiments, there may be fewer or more phasor signals 514.

Figure 8:
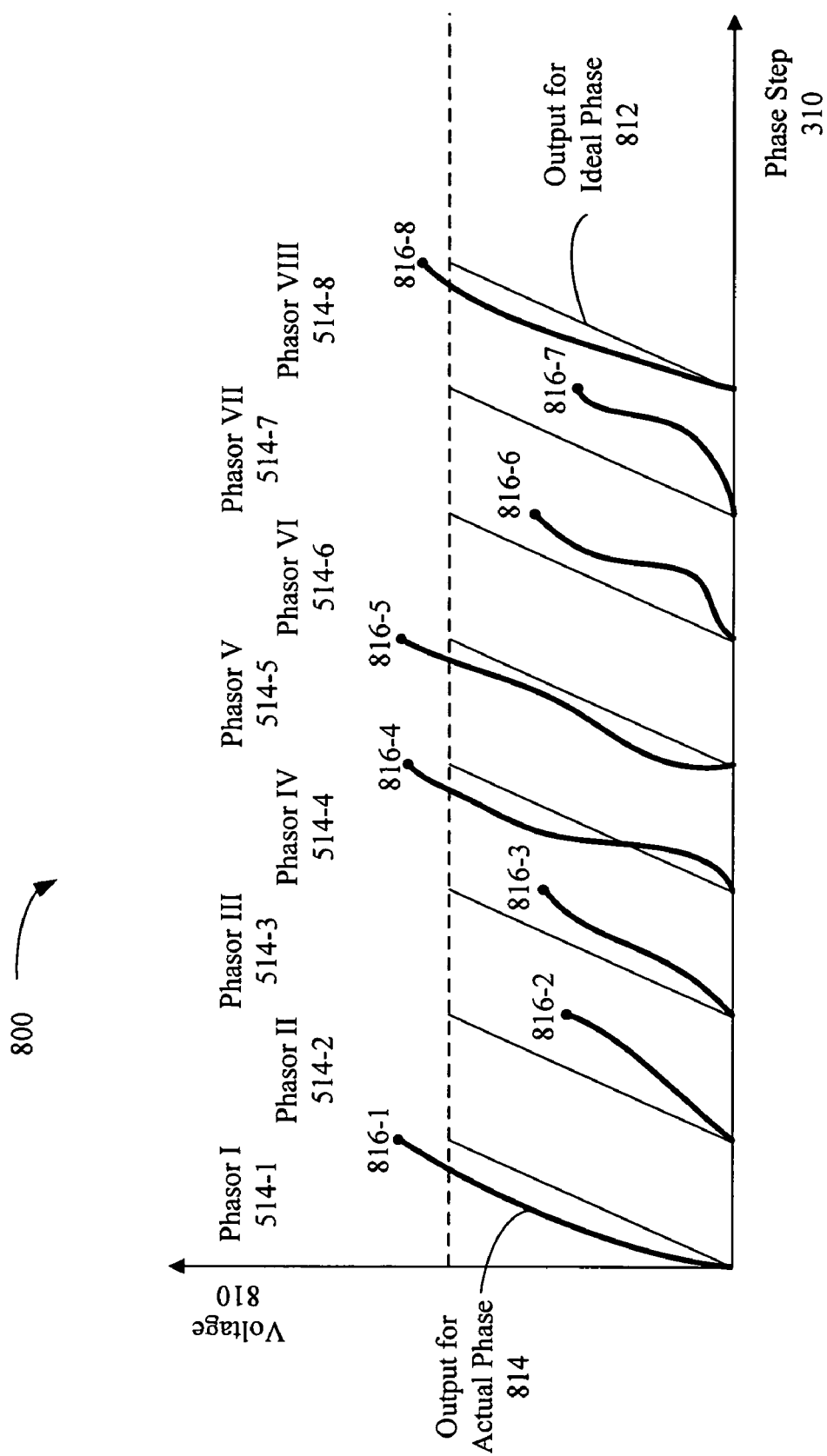
FIG. 8 is a block diagram illustrating an embodiment of determining a calibration scale for a self-test circuit.

In embodiments with a plurality of phasors, such as the phasors 514, there may be a calibration procedure or process that is used to determine a calibration scale for the self-test circuit. The calibration scale may be used when determining the linearity of the phase interpolator. FIG. 8 is a block diagram illustrating an embodiment 800 of determining a calibration scale for a self-test circuit. In the embodiment 800, voltage 810 output by the self-test circuit 408 (FIG. 4) is shown as a function of the phase step 310. Respective phasors 514, such as the phasor 514-1, are used in the phase interpolator 412-1 (FIG. 4) and in the self-test circuit 408 (FIG. 4) to cover the respective subset of the plurality of phase steps, which correspond to the respective subset of the predefined range of phases, such as 0 to 45°.

At a beginning of the respective subset of the plurality of phase steps 310, the offset cancellation circuit 436 (FIG. 4) is used to zero the voltage 610. If the phase interpolator 412-1 (FIG. 4) were perfectly linear, as the phase step 310 is increased (i.e., as the phase between the interpolator output 416 and the reference signal 418 in FIG. 4 is increased) an output for ideal phase 812 would have a linear behavior up to an end boundary of the respective subset of the plurality of phase steps 310. Then, the control logic 438 (FIG. 4) would select another one of the phasors 514 to cover the next respective subset of the plurality of phase steps 310 and the offset cancellation circuit 436 (FIG. 4) is used to zero the output of the ADC 434 (FIG. 4).

Due to the mapping error or nonlinearity in the phase interpolator 412-1 (FIG. 4), however, an output for actual phase 814 deviates from the linear behavior. To determine the calibration scale, voltages 816 at the end boundary of each of the subsets of the plurality of phase steps 310 may be measured and summed to yield a total voltage. The calibration scale is a ratio of this total voltage from the self-test circuit 408 (FIG. 4), corresponding to a predefined range of phases, divided by a number of phase steps. The calibration scale may be scaled by a time interval corresponding to the respective phase step.

In an exemplary embodiment there are 8 phasors 514 and 256 phase steps to cover a range of phases between 0 and 360°. In other embodiments, the range of phases may be less than 0 to 360°. The calibration scale may be determined by measuring voltages 816 only for the last phase step of each subset, and summing those voltages to produce a total voltage. If the total voltage is 512 mV, a step size is determined by dividing the total voltage by the 256 phase steps, yielding a calibration scale of 2 mV/phase step. More generally, the total voltage is divided by $2^N$, $$CalibrationScalePerPhaseStep = \frac{TotalVoltage}{2^N}$$

where $2^N$ is the number of phase steps.

In addition, if the clock period is 500 ps then there are 1.953125 ps/phase step or about 0.9765625 ps/mV. As discussed further below with reference to FIG. 10, the measured voltage 810 at a respective phase step in the plurality of phase steps 310 minus an expected voltage (a product of the calibration scale and the respective phase step) times 0.9765625 ps/mV is the integral nonlinearity 326 (FIG. 3) in picoseconds.

While the preceding discussion has focused on the integral nonlinearity INL 326 (FIG. 3), in some embodiments the self-test circuit 408 (FIG. 4) and related methods may be used to determine the differential nonlinearity of one or more phase interpolators.

Figure 9:
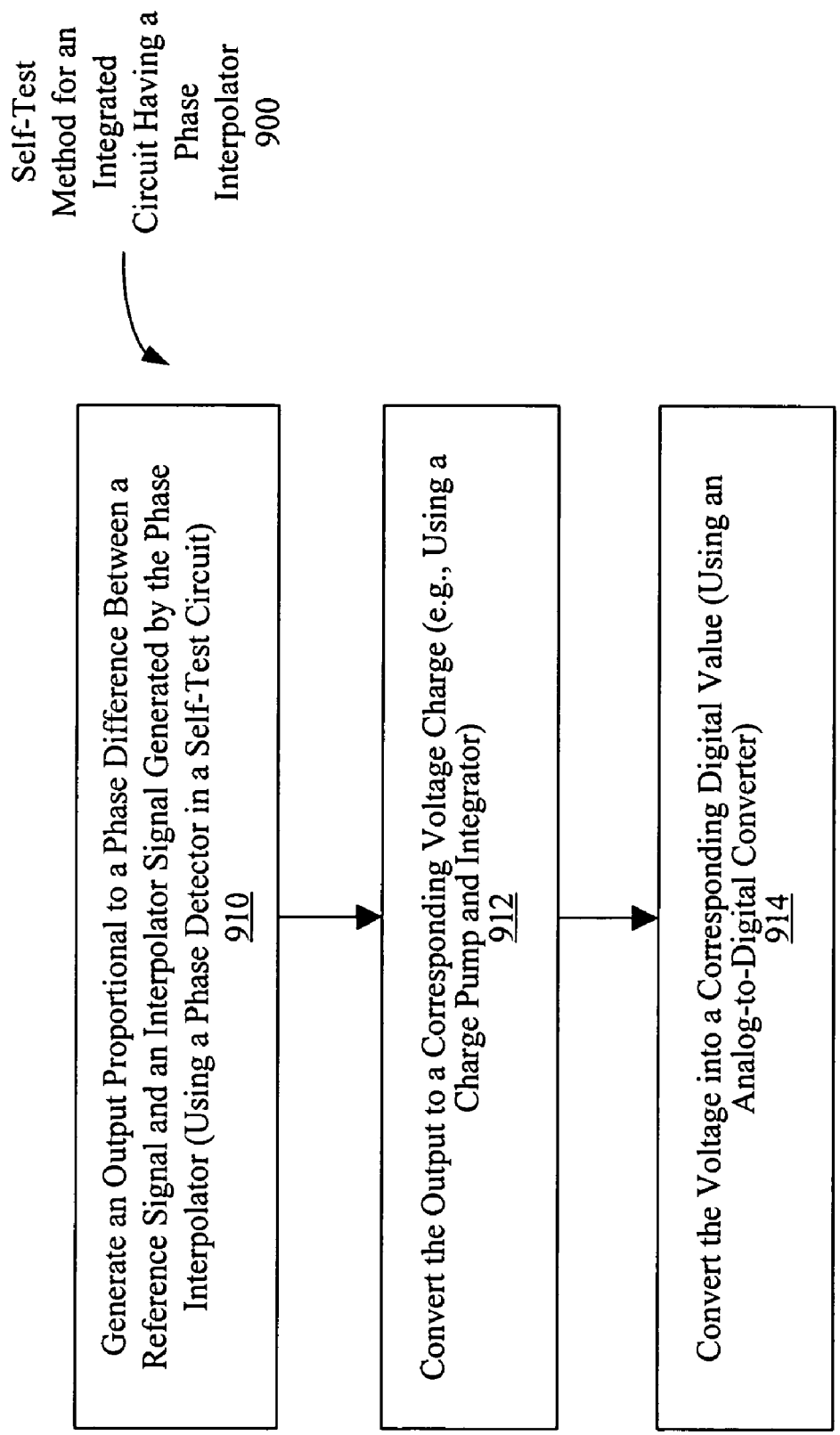
FIG. 9 is a flow diagram illustrating an embodiment of a method of operation of a self-test circuit in an integrated circuit having a phase interpolator.

Attention is now directed towards processes for operating the self-test circuit. FIG. 9 is a flow diagram illustrating an embodiment of a method of operation of a self-test circuit in an integrated circuit having a phase interpolator 900. An output proportional to a phase difference between a reference signal and a interpolator output generated by the phase interpolator is generated (910) (e.g., by using a phase detector in the self-test circuit). The output is converted to a corresponding voltage (e.g., by using a charge pump and integrator) (912). The voltage is converted into a corresponding digital value (e.g., using an analog-to-digital converter) (914). In some embodiments, there may be fewer or additional operations, an order of the operations may be rearranged and/or two or more operations may be combined.

Figure 10:
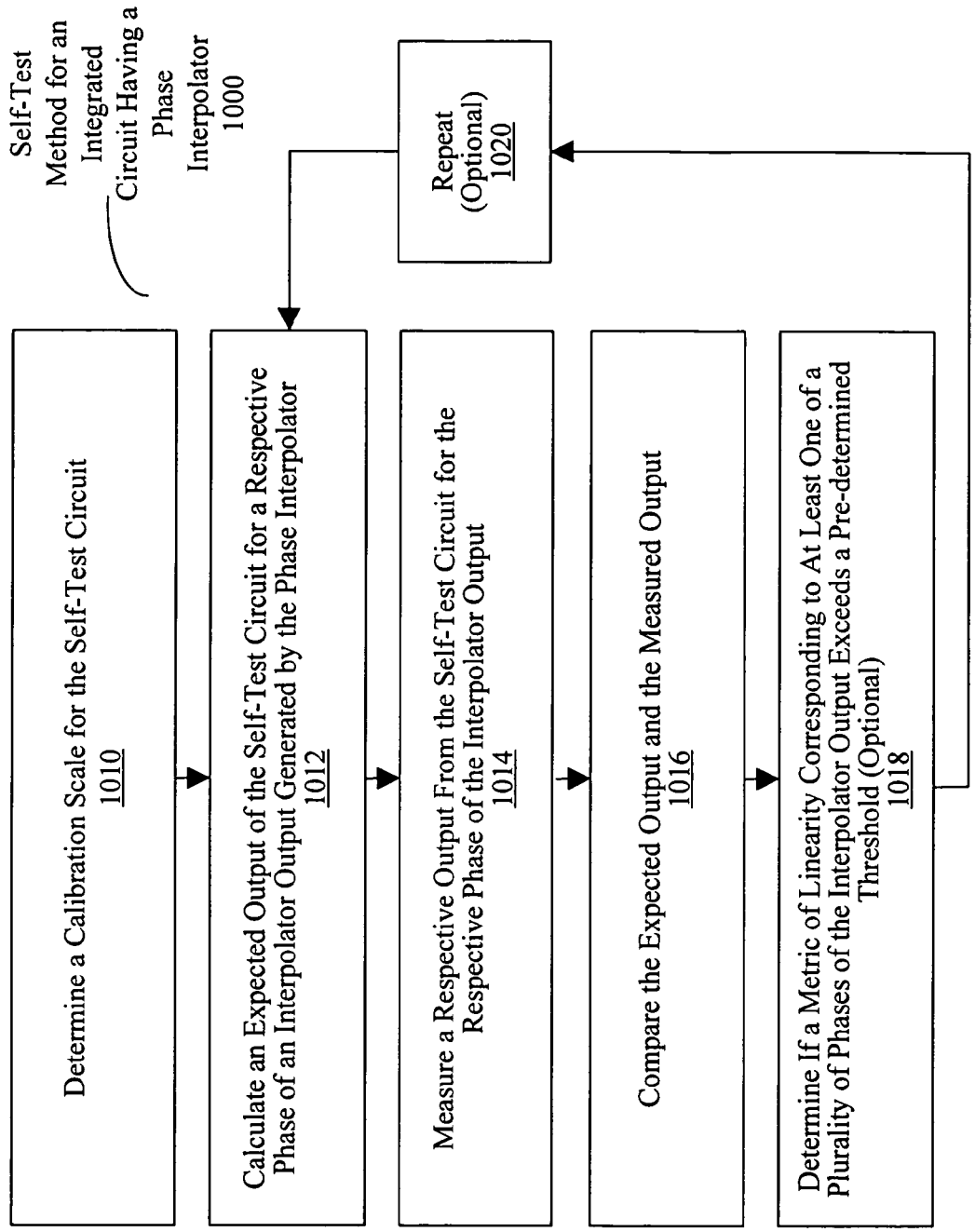
FIG. 10 is a flow diagram illustrating an embodiment of a method of operation of a self-test circuit in an integrated circuit having a phase interpolator.

FIG. 10 is a flow diagram illustrating an embodiment of a method of operation of a self-test circuit in an integrated circuit having a phase interpolator 1000. A calibration scale for the self-test circuit is determined (1010). In some embodiments, the determining of the calibration scale 1010 includes determining a phase offset cancellation or correction (for example, using the offset cancellation circuit 436 in FIG. 4). An expected output of the self-test circuit is calculated for a respective phase of a interpolator output generated by the phase interpolator (1012). The respective phase may correspond to the respective phase step in the plurality of phase steps. A respective output from the self-test circuit is measured for the respective phase of the interpolator output (1014). The expected output and the measured output are compared (1016). The comparing may produce a metric of the linearity of the phase interpolator for the respective phase of the interpolator output (such as the integral nonlinearity INL 326 in FIG. 3). Optionally, the method includes determining if the metric corresponding to at least one of the plurality of phases of the interpolator output exceeds a pre-determined threshold (1018). For example, the pre-determined threshold, such as an integral nonlinearity of 20 ps at any phase step in the plurality of phase steps, may correspond to a pass/fail boundary for the integrated circuit. The calculating (1012), measuring (1014) and comparing (1016) operations may be optionally repeated for a plurality of phases of the interpolator output, corresponding to a plurality of phase steps (1020). In some embodiments, there may be fewer or additional operations, an order of the operations may be rearranged and/or two or more operations may be combined. For example, in some embodiments the measuring (1014) may be performed while determining the calibration scale (1010).

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

Figure 11:
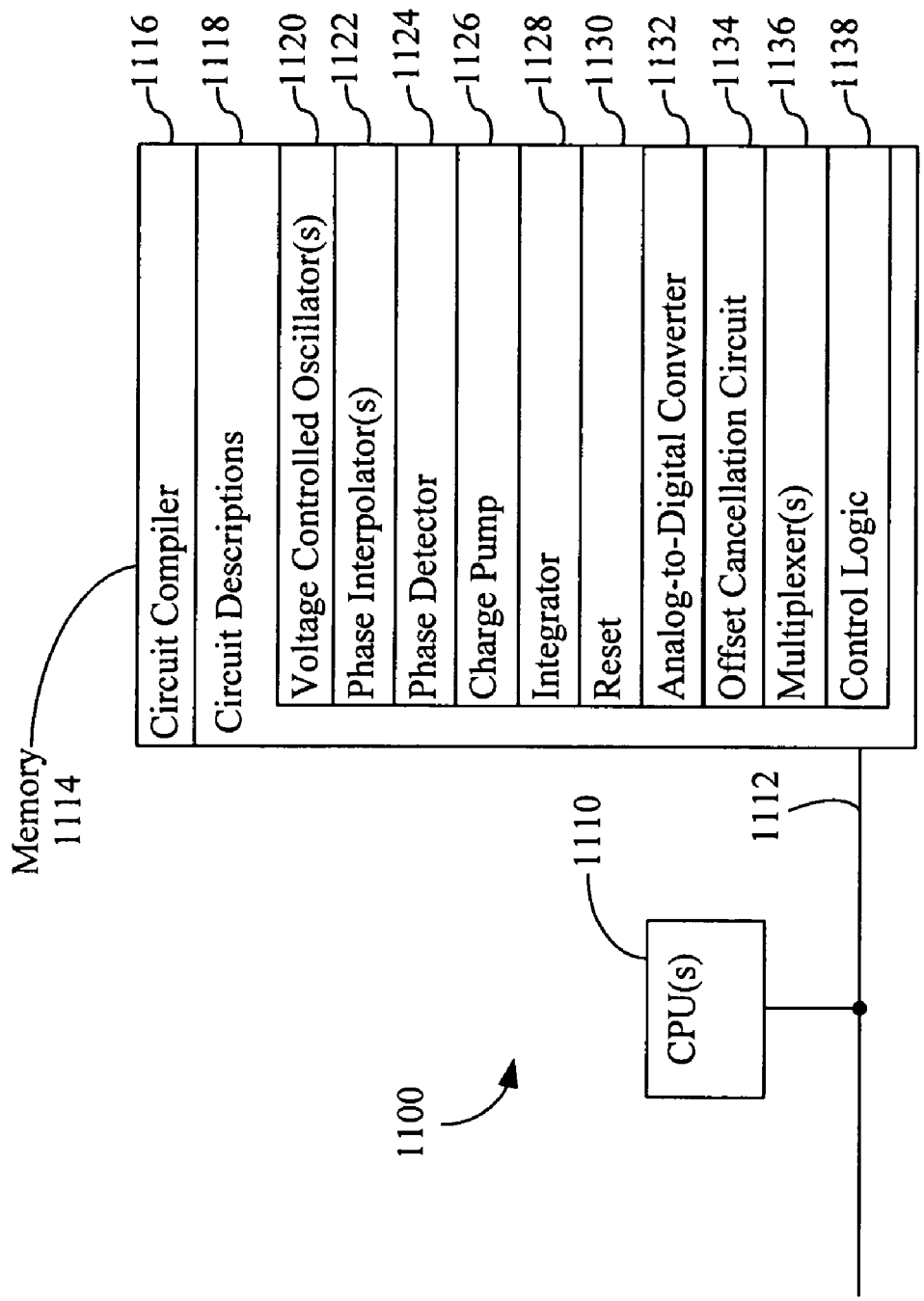
FIG. 11 is a block diagram illustrating an embodiment of a system.

FIG. 11 is a block diagram an embodiment of a system 1100 for storing computer readable files containing software descriptions of the circuits. The system 1100 may include at least one data processor or central processing unit (CPU) 1110, memory 1114 and one or more signal lines or communication busses 1112 for coupling these components to one another. Memory 1114 may include high-speed random access memory and/or non-volatile memory, such as one or more magnetic disk storage devices. Memory 1114 may store a circuit compiler 1116 and circuit descriptions 1118. Circuit descriptions 1118 may include circuit descriptions for one or more voltage controlled oscillators 1120, one or more phase interpolator(s) 1122, a phase detector 1124, a charge pump 1126, an integrator 1128, a reset 1130, an analog-to-digital converter 1132, an offset cancellation circuit 1134, one or more multiplexer(s) 1136 and/or control logic 1138.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit, comprising:
a phase interpolator that is to provide a interpolator output, wherein the interpolator output is a weighted combination of one or more of a plurality of phasor signals, and wherein the interpolator output has a phase corresponding to a respective phase step in a plurality of phase steps; and
a self-test circuit, the self-test circuit including:
a phase detector that is to couple to a reference signal and the interpolator output, wherein the phase detector is to generate an output that is proportional to a phase difference between the reference signal and the interpolator output;
a phase-difference-to-voltage converter, wherein the phase-difference-to-voltage converter is convert the output from the phase detector into a corresponding voltage, and wherein the phase-difference-to-voltage converter includes a charge pump;
an analog-to-digital converter (ADC) coupled to the phase-difference-to-voltage converter, wherein the ADC is to convert an output from the phase-difference-to-voltage converter into a corresponding digital value; and
control logic, wherein the control logic is to test the phase interpolator using the self-test circuit.

2. The circuit of claim 1, wherein the output from the phase detector comprises one or more pulses.

3. The circuit of claim 1, wherein the interpolator output and the reference signal are each periodic signals having a same fundamental frequency.

4. The circuit of claim 1, wherein the phase-difference-to-voltage converter further includes an integrator coupled to the charge pump and the ADC, wherein the integrator is to integrate charge output by the charge pump for a pre-determined number of clock cycles and is to output a voltage corresponding to the integrated charge.

5. The circuit of claim 4, wherein the integrator includes a reset, and wherein the reset is to set an output of the integrator to approximately zero after the pre-determined number of clock cycles.

6. The circuit of claim 1, further comprising a multiplexer coupled to the phase detector and the self-test circuit, wherein the multiplexer is to couple the reference signal to the phase detector, and wherein the reference signal corresponds to a respective phasor in the plurality of phasor signals for a corresponding subset of the plurality of phase steps, the subset of phase steps corresponding to a respective subset of a predefined range of phases.

7. The circuit of claim 6, further comprising an offset cancellation circuit, wherein the offset cancellation circuit adjusts the charge pump such that the digital value corresponds to approximately zero phase difference when the reference signal and the output from the phase-difference-to-voltage converter each correspond to the respective phasor signal.

8. The circuit of claim 1, wherein the reference signal is provided by a voltage controlled oscillator.

9. A circuit, comprising:
  first means for providing a interpolator output, wherein the interpolator output is a weighted combination of one or more of a plurality of phasor signals, and wherein the interpolator output has a phase corresponding to a respective phase step in a plurality of phase steps; and
  a self-test circuit, the self-test circuit including:
    second means for generating an output that is proportional to a phase difference between a reference signal and the interpolator output;
    third means for converting the output from the second means into a corresponding voltage;
    fourth means for converting an output from the third means into a corresponding digital value; and
    fifth means for testing the first means using the self-test circuit.

10. A method of testing a phase interpolator in an integrated circuit, comprising:
  performing a self-test within the integrated circuit, including:
    generating an output that is proportional to a phase difference between a reference signal and a interpolator output produced by the phase interpolator as a weighted combination of one or more of a plurality of phasor signals, and wherein the interpolator output has a phase corresponding to a respective phase step in a plurality of phase steps;
    converting the output to a corresponding voltage; and
    converting the voltage into a corresponding digital value.

11. The method of claim 10, further comprising coupling the interpolator output to a phase detector.

12. The method of claim 10, wherein the output comprises one or more pulses.

13. The method of claim 10, wherein the interpolator output and the reference signal are each periodic signals having a same fundamental frequency.

14. The method of claim 10, further comprising integrating a charge corresponding to the output for a pre-determined number of clock cycles and providing a voltage corresponding to the charge.

15. The method of claim 14, further comprising resetting an output of the integrator to approximately zero after the pre-determined number of clock cycles.

16. The method of claim 10, further comprising coupling the reference signal to a charge pump.

17. The method of claim 16, wherein the reference signal corresponds to a respective phasor in the plurality of phasor signals for a corresponding subset of the plurality of phase steps, and wherein the subset of phase steps corresponds to a respective subset of a predefined range of phases.

18. The method of claim of claim 17, further comprising adjusting a charge pump such that the digital value corresponds to approximately zero phase difference when the reference signal and the interpolator output each correspond to the respective phasor signal.

19. The method of claim 10, wherein the reference signal is provided by a voltage controlled oscillator.

20. A method of determining linearity of a phase interpolator, comprising:
  determining a calibration scale for a circuit, wherein the circuit generates an output corresponding to a phase difference between a interpolator output provided by the phase interpolator and a reference signal, and wherein the calibration scale is a ratio of an output from the circuit corresponding to a predefined range of phases divided by a number of phase steps;
  calculating an expected output from the circuit for a respective phase of the interpolator output, wherein the respective phase corresponds to a respective phase step in a plurality of phase steps;
  measuring a respective output from the circuit for the respective phase of the interpolator output; and
  comparing the expected output and the measured output, wherein the comparing produces a metric of the linearity of the phase interpolator for the respective phase of the interpolator output.

21. The method of claim 20, wherein the method is performed as part of self-test in an integrated circuit.

22. The method of claim 20, wherein the output from the circuit corresponds to a summation of a plurality of outputs, and wherein a respective output in the plurality of outputs corresponds to a respective subset of the predefined range of phases.

23. The method of claim 20, further comprising scaling the metric by a time interval corresponding to the respective phase step.

24. The method of claim 20, further comprising repeating the calculating, measuring and comparing operations for a plurality of phases of the interpolator output corresponding to the plurality of phase steps.

25. The method of claim 24, further comprising determining if the metric corresponding to one of the plurality of phases of the interpolator output exceeds a pre-determined threshold.

26. The method of claim 20, wherein the measuring is performed while determining the calibration scale.

27. The method of claim 20, wherein the reference signal corresponds to a respective phasor in a plurality of phasor signals for a subset of the plurality of phase steps corresponding to a respective subset of the predefined range of phases.

28. The method of claim 20, wherein the reference signal is provided by a voltage controlled oscillator.

29. The method of claim 20, wherein the interpolator output is a weighted combination of one or more phasor signals.

30. The method of claim 20, wherein the comparing includes generating an output that is proportional to a phase difference between the reference signal and the interpolator output, converting the output from the phase detector into a corresponding charge, and converting the charge into a corresponding digital value.

* * * * *